(12) United States Patent
Tsuchido et al.

(10) Patent No.: US 6,621,429 B2
(45) Date of Patent: Sep. 16, 2003

(54) HUFFMAN DECODING METHOD AND DECODER, HUFFMAN DECODING TABLE, METHOD OF PREPARING THE TABLE, AND STORAGE MEDIA

(75) Inventors: Toshiaki Tsuchido, Inasa-gun (JP); Atsushi Ishida, Hamakita (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/081,999

(22) Filed: Feb. 22, 2002

(65) Prior Publication Data

US 2002/0130796 A1 Sep. 19, 2002

(30) Foreign Application Priority Data

Feb. 23, 2001 (JP) .................................... 2001-047823

(51) Int. Cl.$^7$ ................................................ H03M 7/40
(52) U.S. Cl. .................................................... 341/65
(58) Field of Search ............................ 341/65, 64, 63, 341/67

(56) References Cited

U.S. PATENT DOCUMENTS 4,535,320 A * 8/1985 Weaver ..................... 341/65
6,484,142 B1 * 11/2002 Miyasaka ................. 341/65

* cited by examiner

Primary Examiner—Brian Young
(74) Attorney, Agent, or Firm—Pillsbury Winthrop LLP

(57) ABSTRACT

There are provided a Huffman decoding method and decoder which is capable of carrying out a decoding process at a high speed with a small memory capacity, and requires only a small-sized circuit. Input data encoded by a Huffman code is decoded. A Huffman decoding table is prepared which describes a binary tree corresponding to the Huffman code and having leaves each storing data. A binary tree-based search of the table is carried out based on the input data sequentially acquired by at least one bit to thereby decode the input data encoded by the Huffman code.

5 Claims, 8 Drawing Sheets

FIG. 2
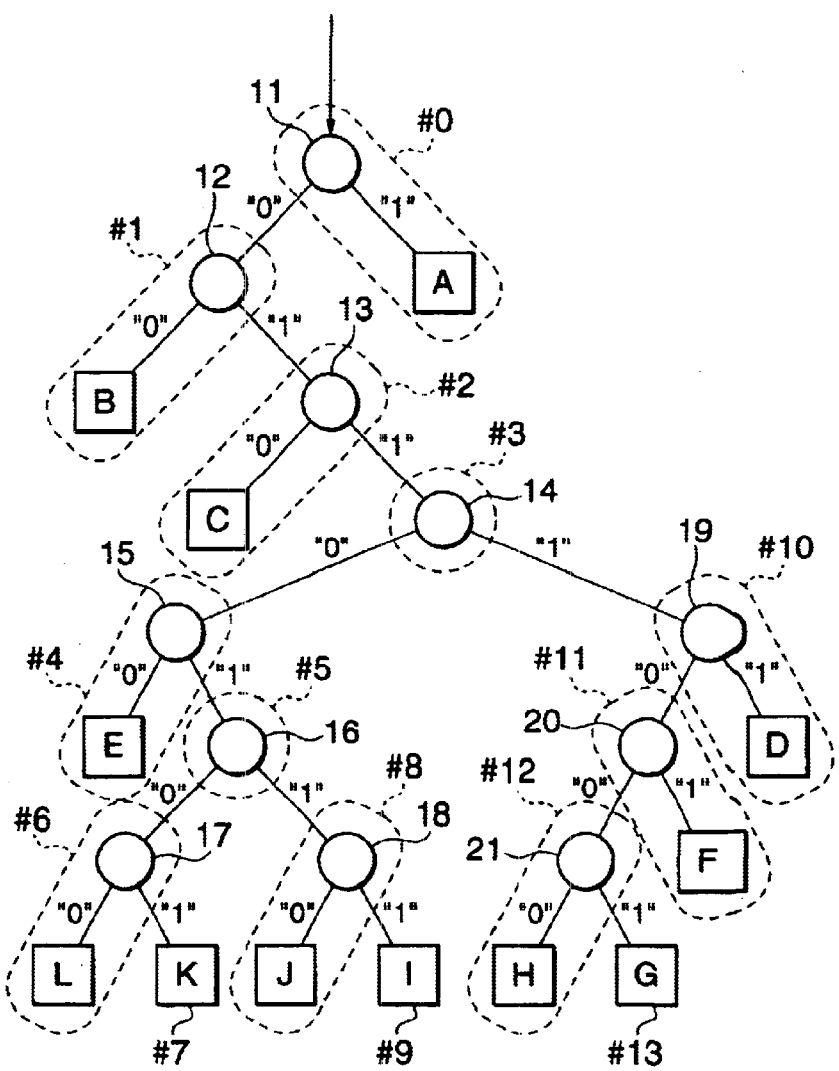
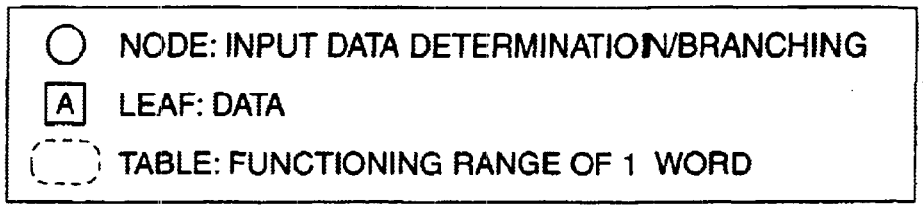
○ NODE: INPUT DATA DETERMINATION/BRANCHING
[A] LEAF: DATA
(⎯) TABLE: FUNCTIONING RANGE OF 1 WORD

FIG. 3

| #adr | SYMBOL OF FLAG | DATA |
|---|---|---|
| 0 | DH | "A" |
| 1 | DL | "B" |
| 2 | DL | "C" |
| 3 | JH | 10 |
| 4 | DL | "E" |
| 5 | JH | 8 |
| 6 | DL | "L" |
| 7 | S | "K" |
| 8 | DL | "J" |
| 9 | S | "I" |
| 10 | DH | "D" |
| 11 | DH | "F" |
| 12 | DL | "H" |
| 13 | S | "G" |

FIG. 4

| CODE | SYMBOL | MEANING |
|------|--------|---------|
| 00 | DL | EXTRACT 1 BIT FROM INPUT DATA STREAM, AND IF IT IS 0, WHICH INDICATES AGREEMENT WITH CODEWORD, OUTPUT DATA, WHEREAS IF IT IS 1, REFER TO NEXT ADDRESS IN TABLE. |
| 01 | DH | EXTRACT 1 BIT FROM INPUT DATA STREAM, AND IF IT IS 0, REFER TO NEXT ADDRESS IN TABLE, WHEREAS IF IT IS 1, WHICH INDICATES AGREEMENT WITH CODEWORD, OUTPUT DATA. |
| 10 | S | INHIBIT EXTRACTION FROM INPUT DATA STREAM, BUT UNCONDITIONALLY OUTPUT DATA. |
| 11 | JH | EXTRACT 1 BIT FROM INPUT DATA STREAM, AND IF IT IS 0, REFER TO NEXT ADDRESS IN TABLE, WHEREAS IF IT IS 1, SHIFT TO ADDRESS INDICATED BY DATA. |

(BINARY)

FIG. 6

| ADDRESS (#adr) | DATA | CODE LENGTH (length) | CODEWORD (codeword) |
|---|---|---|---|
| 0 | "A" | 1 | 1 |
| 1 | "B" | 2 | 00 |
| 2 | "C" | 3 | 010 |
| 3 | "D" | 5 | 01111 |
| 4 | "E" | 5 | 01100 |
| 5 | "F" | 6 | 011101 |
| 6 | "G" | 7 | 0111001 |
| 7 | "H" | 7 | 0111000 |
| 8 | "I" | 7 | 0110111 |
| 9 | "J" | 7 | 0110110 |
| 10 | "K" | 7 | 0110101 |
| 11 | "L" | 7 | 0110100 |

(BINARY)

PRIOR ART

PRIOR ART

HUFFMAN DECODING METHOD AND DECODER, HUFFMAN DECODING TABLE, METHOD OF PREPARING THE TABLE, AND STORAGE MEDIA

BACKGROUND OF THE INVENTION

1. Field of the Invention

The present invention relates to a Huffman decoding method and decoder, a Huffman decoding table, a method of preparing the table, and storage media storing respective programs for executing the methods.

2. Description of the Related Art

Huffman coding encodes symbols by assigning thereto respective codewords having lengths corresponding to probabilities of occurrence of the symbols to thereby minimize the average length of encoded symbols. Huffman coding is known as a typical method of entropy encoding (variable length encoding), and widely used e.g. in compression of multi-media data, such as image data and voice data.

An example of a conventional Huffman decoder will be described with reference to FIGS. 6 to 8. It is assumed here that input data encoded by using a Huffman coding table shown in FIG. 6 are decoded. That is, data (symbol) "A" is assigned with a codeword "1"having a code length of 1 (bit), data "B" a codeword "00" having a code length of 2(bits), data "C" a codeword "010" having a code length of 3(bits), data "D" and "E"codewords "01111" and "01100" each having a code length of 5 (bits), data "F" a codeword "011101", having a code length of 6 (bits), and data "G", "H", "I", "J", "K", and "L" codewords "0111001", "0111000", "0110111", "0110110", "01101010", and "0110100" each having a code length of 7, respectively.

FIG. 7 shows the construction of the conventional Huffman decoder.

In the figure, reference numeral 31 designates a codeword table storing codewords of the Huffman coding table shown in FIG. 6, reference numeral 32 designates a code length table storing code lengths associated with the respective codewords, and reference numeral 33 designates a data table storing decoded data associated with the respective codewords. Further, reference numerals 34, 35, 36 designate a counter for supplying a read address to the codeword table 31, the code length table 32, and the data table 33, an input data-acquiring circuit for acquiring input data D having the number of bits determined based on a code length (represented by "length" in the figure) read out from the code length table 32, from a stream of input data encoded by Huffman coding, and an agreement-detecting circuit for detecting agreement between a codeword read from the codeword table 31 and the input data D supplied from the input data-acquiring circuit 35.

The flow of processing by the conventional Huffman decoder constructed as described above will be described with reference to. FIG. 8.

First, in a step S21, the input data D retrieved by the input data-acquiring circuit 35, the count n of the counter 34 (i.e. read address for the tables 31 to 33) and code length data L are all set to an initial value 0. Then, the process proceeds to a step S22, wherein an address #n (n=0 immediately after the initialization) of the code length table 32 is accessed to read out a code length therefrom.

Then, the process proceeds to a step S23, wherein it is determined whether or not the code length read out agrees with the code length data L. In the case of n=0, the code length read out from the code length table 32 is 1 (length=1), so that there occurs disagreement between the code length (length=1) read out and the code length data L, which has been initialized to 0, and therefore, the process proceeds to a step S24, wherein the input data-acquiring circuit 35 acquires (length–L) bits (equal to 1 bit in the present case, since L has been initialized to 0) from a stream of input data. That is, the input data D is shifted leftward by the (length–L) bits, and the input data which is (length–L) bits long and has been acquired is added to the shifted input data to update the input data D. In the case of n=0, the original input data D has been initialized to 0, so that the updated input data D is set to data which is 1 bit long from the start position thereof. Then, the value of the code length data L is set to the code length (length=1).

After executing the step S24, or when the code length read out in the step S22 agrees with the code length data L (YES to step S23), the process proceeds to a step S25, wherein a codeword having the address #n is read out from the codeword table 31. Then, it is determined in a step S26 whether or not the codeword read out agrees with the input data D. If the result shows the agreement between the codeword and the input data D, decoded data stored in the address #n of the data table 33 is read out from the data table 33, followed by terminating the decoding of the Huffman encoded data. Then, to decode the next input data, the process starting with the step S21 as described above is carried out again.

On the other hand, if the codeword read out and the input data D do not agree with each other, the program proceeds to a step S28, wherein the count adr of the counter 34 is incremented by 1, and then the process returns to the step S22, so as to repeat the process described above as to a new address (n+1).

Thus, by using the memory storing the Huffman coding table, input data encoded by Huffman coding can be decoded in a round-robin fashion.

It should be noted that there have been proposed various kinds of the Huffman decoding method and decoder other than the above-described one, including a method of using a memory with addresses having the maximum code length, a method of tracing a code tree for each bit, and a method of decoding in a parallel fashion by using a plurality of memories.

In the case of the Huffman decoding method using the Huffman coding table described above, all information of decoding data, code lengths, and codewords is necessary, which increases the required memory capacity of the Huffman coding table. Further, this method is a sequential search-based method which repeatedly carries out a determining process until the agreement between input data and a codeword occurs, and therefore, if data having a long code length is retrieved, the number of times of looking up the table becomes very large, which causes a low efficiency of the decoding process.

Further, in the case of the method using addresses having the maximum code length, it is possible to carry out decoding at a high speed, but it necessitates a very large memory capacity.

Also, in the case of the method of performing parallel processing in order to increase the processing speed, the size of a circuit of the decoder is increased.

SUMMARY OF THE INVENTION

It is a first object of the present invention to provide a Huffman decoding method and decoder which is capable of carrying out a decoding process at a high speed with a small memory capacity, and requires only a small-sized circuit, and a storage medium storing a program for executing the Huffman decoding method.

It is a second object of the present invention to provide a Huffman decoding table for use in the Huffman decoding method and decoder, and a method of preparing the Huffman decoding table, a storage medium storing a program for executing the method of preparing the Huffman decoding table.

To attain the first object, according to a first aspect of the invention, there is provided a Huffman decoding method of decoding input data encoded by a Huffman code, comprising the steps of preparing a table describing a binary tree corresponding to the Huffman code and having leaves each storing data, and carrying out a binary tree-based search of the table, based on the input data sequentially acquired by at least one bit to thereby decode the input data encoded by the Huffman code.

Preferably, the binary tree has first nodes having the leaves connected thereto, second nodes having no leaves connected thereto, and the table stores words corresponding to the leaves of the binary tree, and words corresponding to the second nodes having no leaves connected theretp. The table stores, as the words corresponding to the leaves of the binary tree, decoded data corresponding to the data stored in the leaves, and flags for controlling outputting of the decoded data. The table also stores, as each of the words corresponding to the second nodes having no leaves connected thereto, and address of a word corresponding to one of the first and second nodes connected as branches to each of the second nodes, and a flag for controlling whether or not each of the second nodes should be branched to the address.

To attain the first object, according to a second aspect of the invention, there is provided a Huffman decoder that decodes input data encoded by a Huffman code, comprising a table describing a binary tree corresponding to the Huffman code, a bit-extracting and determining section that extracts one bit by one bit from the input data and determines a value of the extracted one bit, an address generating section that generates a read address for the table, a read address-controlling section that controls the read address for the table to be outputted by the address generating section according to the value of the one bit extracted by the bit-extracting and determining section, and an output section that carries out a binary tree-based search of the table, and outputs decoded data corresponding to the input data.

To attain the first object, according to a third aspect of the invention, there is provided a computer-readable storage medium storing a program for executing a Huffman decoding method of decoding input data encoded by a Huffman code, the program comprising a module for preparing a table describing a binary tree corresponding to the Huffman code and having leaves each storing data, and a module for carrying out a binary tree-based search of the table, based on the input data sequentially acquired by at least one to thereby decode the input data encoded by the Huffman code.

To attain the second object, according to a fourth aspect of the invention, there is provided a Huffman decoding table that describes a binary tree corresponding to a Huffman code and having leaves each storing data, wherein the binary tree has first nodes having the leaves connected thereto, second nodes having no leaves connected thereto, and the table stores words corresponding to the leaves of the binary tree, and words corresponding to the second nodes having no leaves connected thereto. The table stores, as the words corresponding to the leaves of the binary tree, decoded data corresponding to data stored in the leaves, and flags for controlling output of the decoded data. The table stores, as each of the words corresponding to the second nodes having no leaves connected thereto, an address of a word corresponding to one of two of the first and second nodes connected as branches to each of the second nodes, and a flag for controlling whether or not each of the second node should be branched to the address.

To attain the second object, according to a fifth aspect of the invention, there is provided a method of preparing a Huffman decoding table for decoding data encoded by a Huffman code, comprising the steps of a first step of preparing a table describing a binary tree correspondin9 to the Huffman code and having leaves each storing data from a Huffman code table describing the Huffman code, the binary tree having first node having the leaves connected thereto, and second nodes having leaves connected thereto, and a second step of preparing words each comprising decoded data corresponding to the data stored in each of the leaves, and a flag for controlling outputting of the decoded data, in a manner associated with the leaves of the binary tree prepared in the first step. A third step of the method is preparing words each comprising an address of a word corresponding to one of two of the first or second nodes connected as branches to each of the second nodes, and a flag for controlling whether or not each of the second nodes should be brapched to the address, and a fourth step of the method is arranging the words prepared in the second step and the third step, in order of search of the binary tree.

To attain the second object, according to a sixth aspect of the invention, there is provided a computer-readable storage medium storing a program for executing a method of preparing a Huffman decoding table for decoding data encoded by a Huffman code, the program comprising a first module of preparing a table describing a binary tree corresponding to the Huffman code and having leaves each storing data from a Huffman code table describing the Huffman code, the binary tree having first node having the leaves connected thereto, and second nodes having leaves connected thereto, and a second module for preparing words each comprising decoded data corresponding to the data stored in each of the leaves, and a flag for controlling outputting of the decoded data, in a manner associated with the leaves of the binary tree prepared in the first step. The program includes a third module for preparing words each comprising an address of a word corresponding to one of two of the first or second nodes connected as branches to each of the second nodes, and a flag for controlling whether or not each of the second nodes should be brapched to the address, and a fourth module for arranging the words prepared in the second module and the third module in orde of search of the binary tree.

The above and other objects of the present invention will become more apparent from the following detailed description taken in conjunction with the accompanying drawings.

BRIEF DESCRIPTION OF THE DRAWINGS

FIG. 2 is a block diagram showing a binary tree generated from a Huffman coding table shown in FIG. 6;

FIG. 3 is a diagram showing a converting Huffman table for use in the Huffman decoding method according to the present invention;

FIG. 4 shows a table useful in explaining flags used in the converting Huffman table;

FIG. 6 is a diagram showing an example of the Huffman coding table;

DETAILED DESCRIPTION OF THE PREFERRED EMBODIMENTS

Now, the present invention will be described in detail with reference to the drawings showing a preferred embodiment thereof.

Figure 1:
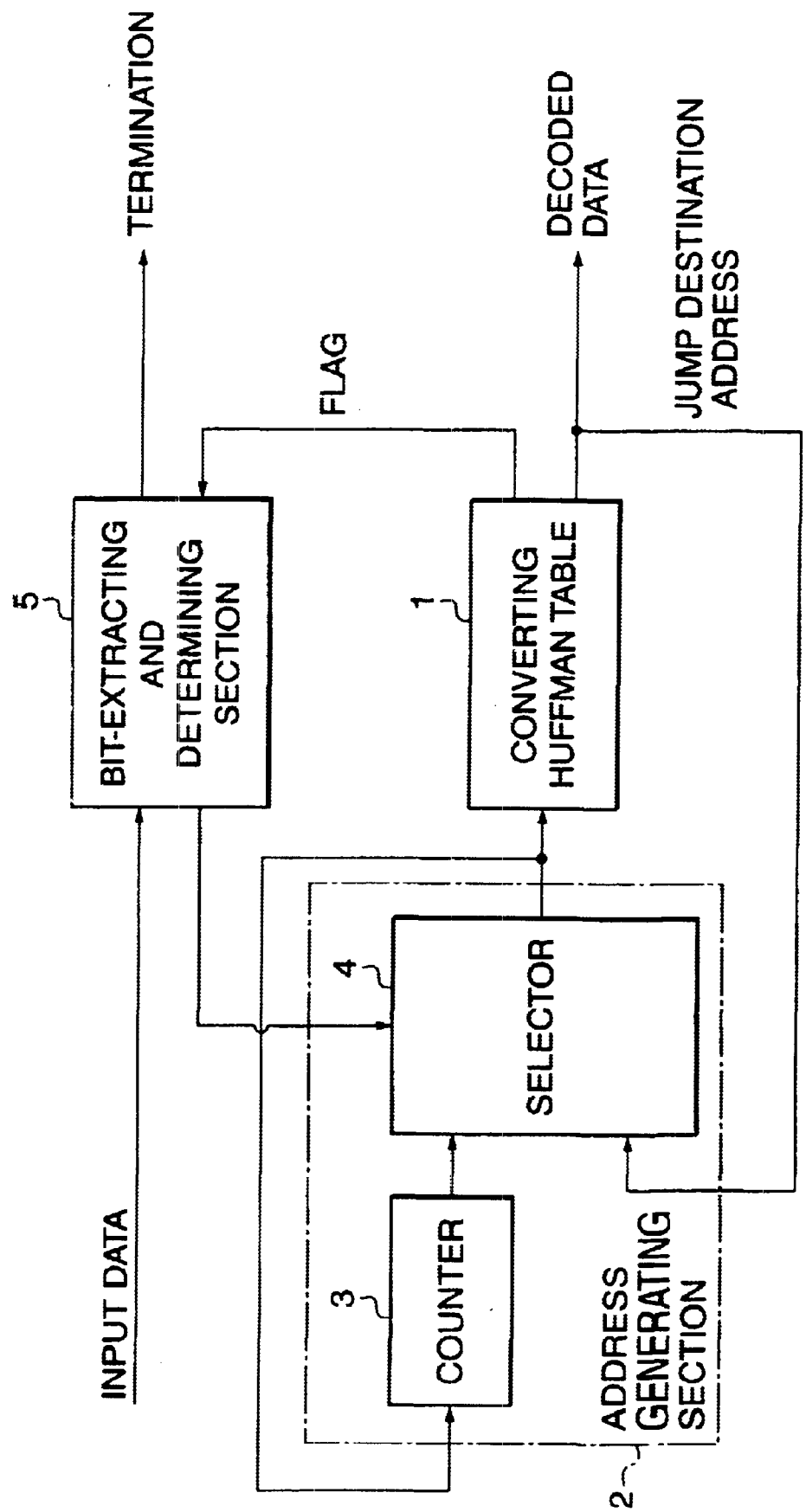
FIG. 1 is a block diagram showing the construction of a Huffman decoder with which a Huffman decoding method according to an embodiment of the present invention is executed.

Referring first to FIG. 1, there is shown the construction of a Huffman decoder according to an embodiment of the present invention, with which is executed a Huffman decoding method according to an embodiment of the present invention. In the figure, reference numeral 1 designates a Huffman decoding table for decoding a Huffman code (hereinafter referred to as "the converting Huffman table") which is used in carrying out the Huffman decoding method according to the present invention. Reference numeral 2 designates an address generating means which has a counter 3 for performing addition by an increment of +1, and a selector 4, and generates a read address for retrieving the converting Huffman table 1, and reference numeral 5 designates a bit-extracting/determining section. In the present embodiment, the converting Huffman table 1 describes a binary tree corresponding to a Huffman code, and stores flags with which the binary tree is searched, and Huffman decoded output data or jump destination addresses, in respective addresses thereof. Further, the bit-extracting/determining section 5 extracts one bit from a stream of input data (hereinafter referred to as "the input data stream") according to a flag read out from the converting Huffman table 1, and determines whether or not the value of the bit is "0" or "1". The selector 4 of the address generating means 2 selects either a value which is provided by the counter 3 after incrementing the output from the selector 4 by +1 or a jump destination address read out from the converting Huffman table 1, based on a control signal from the bit-extracting/determining section 5, and supplies the same to the converting Huffman table 1 as an address.

First, the converting Huffman table 1 and a method of preparing the same will be described with reference to FIGS. 2 to 4. It should be noted that in the illustrated example, similarly to the above-described example of the decoding process of the conventional decoding method, the input data encoded by the Huffman coding table shown in FIG. 6 are decoded.

In the Huffman decoding method of the present embodiment, to prepare the converting Huffman table 1, first, a binary tree shown in FIG. 2 which corresponds to the Huffman code described in the Huffman coding table shown in FIG. 6 is generated from the FIG. 6 table. The binary tree stores each data (symbol) in a corresponding leaf (terminal node) thereof.

That is, as shown in the above-described FIG. 6 Huffman coding table, the first address (address #0) stores a word formed by a code length 1, a codeword "1", and data "A".

From the code length being 1, it is known that the data "A" is stored in a leaf directly connected to a node (branching point, indicated by reference numeral 11 in FIG. 2) which is the root of the binary tree. Assuming that a bit 0 is assigned to a left branch, and a bit 1 is assigned to a right branch, since the codeword is "1", the leaf storing the data "A" is connected to the right branch of the node 11, and a second node 12 is connected to the left branch.

The word stored in the next address #1 of the Huffman coding table in FIG. 6 is formed by a code length 2, a codeword "00" and data "B". Since the code length is 2 and the second bit of the codeword is 0, a leaf storing the data "B" is connected to the left branch (bit 0) of the second node 12, and a third node 13 is connected to the right branch (bit 1).

The word stored in the next address #2 is formed by a code length 3, a codeword "010", and data "C". Since the code length is 3 and the third bit of the codeword is 0, a leaf storing the data "C" is connected to the left branch (bit 0) of the third node 13, and a fourth node 14 is connected to the right branch (bit 1).

The word stored in the next address #3 of the Huffman coding table is formed by a code length 5, a codeword "01111", and data "D". From the code length being 5, it is known that this data "D" is not stored in a leaf directly connected to the fourth node 14, and since the fourth bit of the codeword is 1 and the fifth bit of the same is 1, a leaf storing the data "D" is connected to a right branch of a node (node 19 in FIG. 2) connected to the right branch of the fourth node 14.

Similarly, as to each of the following words stored in the Huffman coding table, by analyzing the code length and codeword thereof, a binary tree corresponding to the Huffman code can be prepared in which data are stored in the respective leaves thereof.

After preparing the binary tree corresponding to the Huffman code as described above, the converting Huffman table 1 is prepared from this binary tree. FIG. 3 shows the converting Huffman table 1 generated from the binary tree shown in FIG. 2. As shown in FIG. 3, stored in each address of the converting Huffman table 1 is a word having a flag area and a data area. In the present embodiment, the flags are four kinds of information which can be expressed by 2-bit data and designated by respective abbreviations DL, DH, S and JH. Further, in the data area of each word, there is stored decoded data or a jump destination address.

The flags DL, DH, S and JH will be described with reference to FIG. 4.

The flag DL is represented by "00", and indicates that if the value of one bit extracted from the input data stream is 0, it should be determined that the corresponding portion of the input data stream agrees with the codeword, and the data stored in the data area of the present address storing the flag should be outputted as decoded data, while if the value is 1, the next address (present address+1) in the converting Huffman table should be referred to.

The flag DH is represented by "01", and indicates that if the value of one bit extracted from the input data stream is 1, it should be determined that the corresponding portion of the input data stream agrees with the codeword, and the data stored in the data area of the present address storing the flag should be outputted as decoded data, while if the value is 0, the next address in the converting Huffman table 1 should be referred to.

The flag S is represented by "10", and indicates that data stored in the data area of the present address storing the flag S should be unconditionally outputted as decoded data without extracting data from the input data stream.

The flag JH is represented by "11", and indicates that if the value of one bit extracted from the input data stream is 0, the next address in the converting Huffman table 1 should be referred to, while if the value is 1, the address should be shifted (jumped) to an address stored in the data area of the corresponding address storing the flag. Here, this jump destination address is indicated by a relative address from the start position of the converting Huffman table.

Although in the above example, if the value is 1, the address is shifted to an address stored in the data area of the corresponding address, the address itself need not be stored in the data area, and alternatively a value which is offset from the present address value may be stored. In this case, in the FIG. 3 example, if #adr is "3", "+7" is stored instead of "10", and if #adr is "5", "+3" is stored instead of "8".

The procedure for generating the FIG. 3 converting Huffman table 1 from the FIG. 2 binary tree will now be described.

As shown in FIG. 2, the node of the binary tree is categorized into four kinds: (1) a leaf where data is stored (terminal node), (2) a node having one leaf (branching node), (3) a node having two leaves, and (4) a node having no leaf.

Nodes of (2) and (3) having a leaf or leaves are assigned with the flag DH or DL, and data stored in the respective leaves connected to branches of these nodes are stored in the data areas of the corresponding addresses storing the flags of the converting Huffman table. More specifically, as to a node of (2) having one leaf, if a bit of a codeword corresponding to the branch connected to the leaf is "0", the node is assigned with the flag DL, while if the bit is "1", the node is assigned with the flag DH, and data stored in the leaf is stored in the data area of the corresponding address storing the flag as decoded data to form one word in the converting Huffman table. Further, as to a node of (3) having two leaves, one of the two branches thereof is assigned with the flag DL or DH, similarly to the case of the node of (2), and data stored in the leaf connected to the branch is stored as decoded data in the data area of the corresponding address storing the flag. Then, as to the other branch, the next address is assigned with the flag S, and data stored in the leaf is stored as decoded data in the data area of this address. These operations make it possible to generate words corresponding to all the leaves.

Further, nodes of (4) having no leaf are assigned with the flag JH, and after the addresses of the converting Huffman table have been determined by arranging words formed as described above in the order of search of the binary tree, a jump destination address (address of a word corresponding to a node selected when a bit of a codeword corresponding to the node is "1") is stored in the data area of the corresponding address storing the flag.

In the example shown in FIG. 2, first, as to the node 11 as the root, the leaf storing the data "A" is connected to the branch (right branch) thereof assigned with the bit 1, and therefore, the flag DH ("01") that is used to determine that the corresponding portion of the input data stream agrees with the codeword when the bit extracted from the input data stream is 1, is stored in the address #0 of the converting Huffman table together with decoded data ("A") corresponding to the data "A" stored in the leaf.

Then, as to the node 12 (second node) connected to the left branch of the root node, since the leaf storing the data "B" is connected to the left branch (bit 0) thereof, the flag DL ("01") and decoded data ("B") corresponding to the data "B" are stored in the address #1 of the converting Huffman table. Similarly, as to the third node 13 connected to the right branch of the second node 12, the flag DL and decoded data ("C") corresponding to the data "C" are stored in the address #2 of the converting Huffman table.

Further, since the fourth node 14 connected to the right branch of the third node 13 has no leaf, the flag JH is stored in the corresponding address (address #3) of the converting Huffman table, and no data is stored in the corresponding data area until a jump destination address therefor is determined.

Next, a fifth node 15 connected to a left branch of the fourth node 14 has a left branch (bit 0) to which is connected a leaf storing data "E", so that the flag DL ("00") that is used to determine that the corresponding portion of the input data stream agrees with the codeword if the bit extracted from the input data stream is 0, is written in the flag area of an address #4, and decoded data ("E") corresponding to the data "E" is written in the data area of the same.

A sixth node 16 connected to a right branch (bit 1) of the fifth node 15 is of the type (4) having no leaf so that the flag JH is stored in an address #5 of the converting Huffman table. It should be noted that a jump destination address is written in the data area, after this address is determined.

A seventh node 17 connected to a left branch (bit 0) of the sixth node 16 has a left branch (bit 0) to which is connected a leaf storing data "L", so that the flag DL is stored in the flag area of an address #6 of the converting Huffman table, and decoded data ("L") corresponding to the data "L" is stored in the data area of the same.

Further, the seventh node 17 has a right branch (bit 1) to which is connected a leaf storing data "K", so that the flag S ('10') and decoded data ("K") corresponding to the data "K" are stored in an address #7 of the converting Huffman table.

Next, processing concerning an eighth node 18 connected to a right branch (bit 1) of the sixth node 16 is carried out. The eighth node 18 has a left branch to which is connected a leaf storing data "J", so that the flag DL and decoded data ("J") corresponding to the data "J" are stored in an address #8 of the converting Huffman table. Further, it is determined at this time point that the address to which the sixth node 16 branches is the address #8, the jump address "8" is written in the data area of the address #5 corresponding to the sixth node 16, which has been made pending.

Further, the eighth node 18 has a right branch (bit 1) to which is connected a leaf storing data "I", the flag S and decoded data ("I") corresponding to the data "I" are stored in an address #9 of the converting Huffman table.

This completes the processing concerning branches directly and indirectly connected to the left branch of the fourth node 14, and subsequently, processing concerning branches connected directly and indirectly to the right branch of the same is carried out.

The right branch (bit 1) of the fourth node 14 has a ninth node 19 connected thereto. The ninth node 19 has a left branch (bit 0) to which is connected a tenth node 20, and a right branch (bit 1) to which is connected a leaf storing data "D". Therefore, the flag DH is stored in the flag area of an address #10 of the converting Huffman table and decoded data ("D") corresponding to the data "D" is stored in the data area of the same. Further, it is determined at this time point that the storing address associated with the node (ninth node) 19 connected to the right branch of the fourth node 14 is #10, and therefore, 10 indicative of the address #10 is stored as the jump destination address in the data area of a word (of the address #3) of the fourth node 14.

The tenth node 20 connected to the left branch of the node 19 of the ninth node has a left branch (bit 0) to which is connected an eleventh node 21, and a right branch (bit 1) to which is connected a leaf storing the data "F". Therefore, the flag DH and decoded data ("F") corresponding to the data "F" are stored in an address #11 of the converting Huffman table.

The eleventh node 21 connected to the left branch of the tenth node 20 has a left branch to which is connected a leaf storing data "H" and a right branch to which is connected a leaf storing data "G". Therefore, the flag DL and decoded data ("H") corresponding to the data "H" are stored in an address #12, and the flag S and decoded data ("G") corresponding to the data "G" are stored in an address #13 of the converting Huffman table.

Although in the example described above, the converting Huffman table 1 is generated by sequentially determining addresses in the order of search of the binary tree, this is not limitative, but after words corresponding to respective nodes are determined, the determined words may be arranged in the order of search of the binary tree to thereby prepare the converting Huffman table 1.

Further, although in the above-described example, the flag JH is defined such that when the bit extracted from the input data stream is 0, the next address should be referred to, and when the same is 1, the address should be jumped to a jump destination address, this is not limitative, but it may be defined such that when the bit is 1, the next address should be referred to, and when the same is 0, the address should be jumped.

Thus, from the binary tree describing the Huffman code, it is possible to prepare the converting Huffman table. The prepared converting Huffman table is composed of 2-bit flag areas and data areas, each storing decoded data or a jump destination address, which are stored in respective storing addresses. That is, the converting Huffman table according to the present embodiment stores, differently from the Huffman coding table (shown in FIG. 6) which stores decoded data, a code length, and a codeword, in each of the storing addresses, stores a 2bit flag, and decoded data or a jump destination address in each of storing addresses.

On the other hand, the number of addresses (the number of words stored in the converting Huffman table) is, in this example, equal to the number of codewords+2, and compared with the Huffman coding table shown in FIG. 6, the number is increased by the number of addresses storing the flag JH (i.e. the number of nodes having no leaf).

However, as described above, the length of each word is as small as the number of bits of decoded data+2 bits, and therefore, it is possible to decrease the size of the table as a whole.

Figure 5:
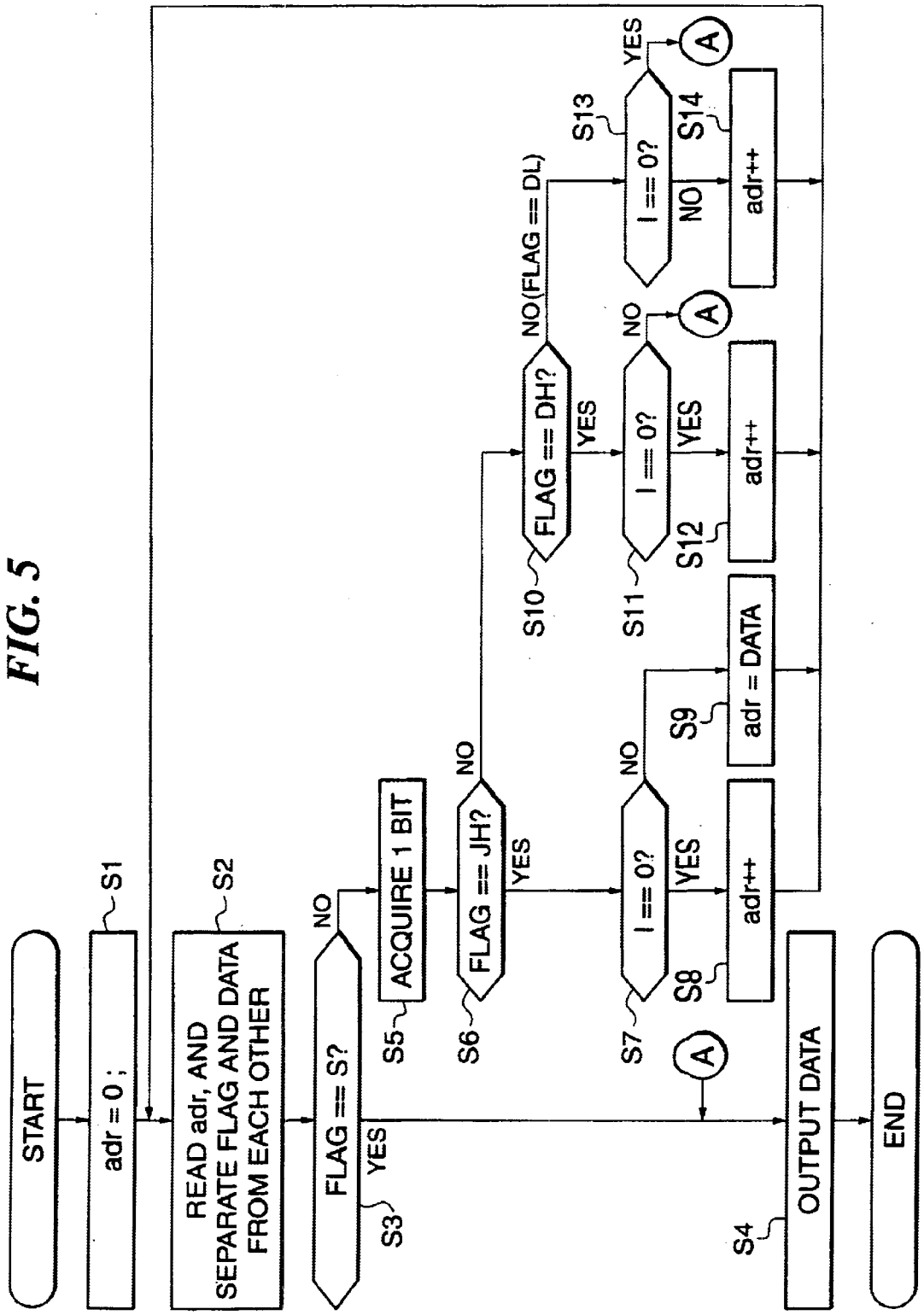
FIG. 5 is a flowchart useful in explaining a flow of a decoding process executed by the Huffman decoder according to the embodiment.
Figure 7:
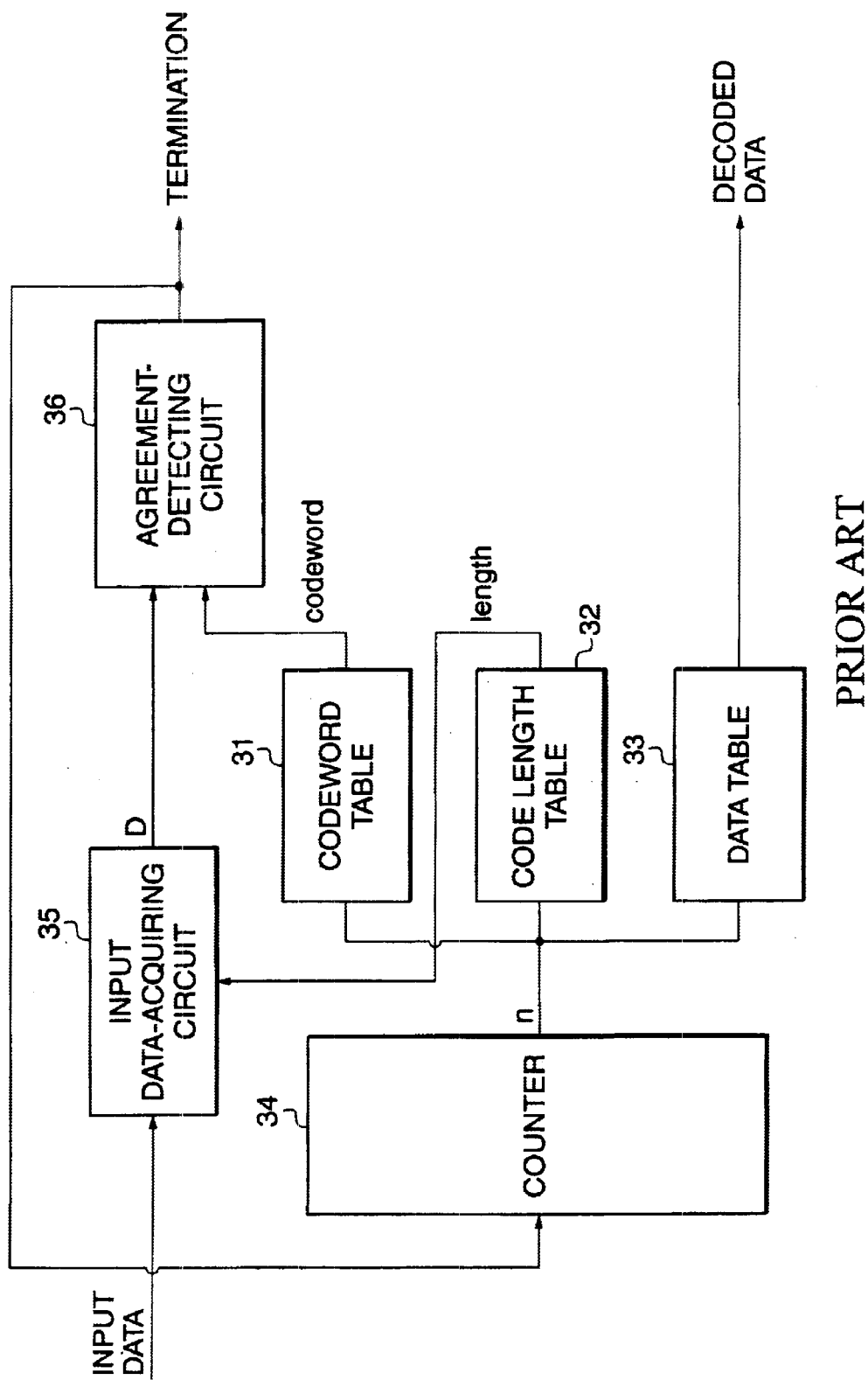
FIG. 7 is a diagram showing an example of the construction of a conventional Huffman decoder.
Figure 8:
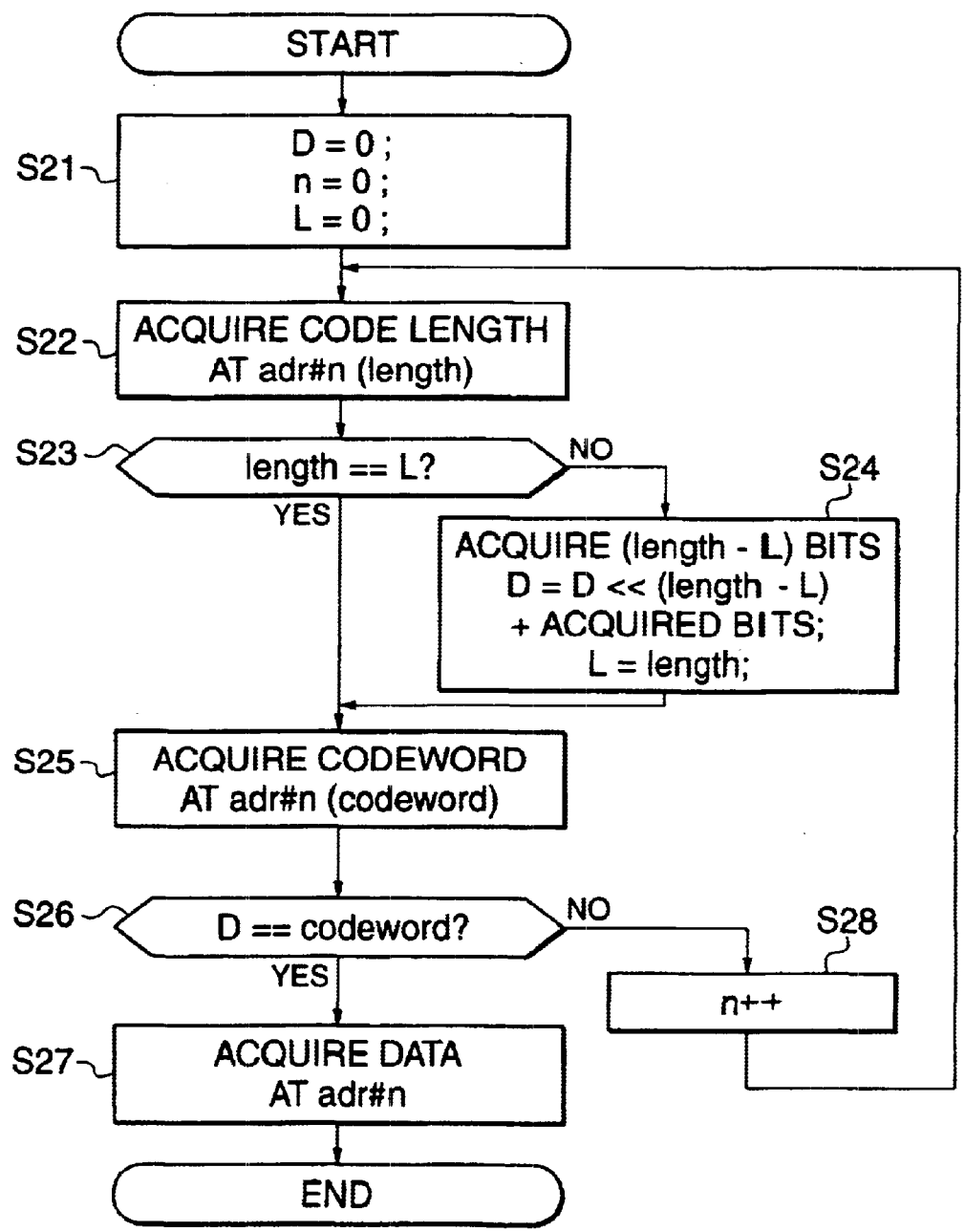
FIG. 8 is a flowchart useful for explaining a flow of a decoding process executed by the conventional Huffman decoder.

Next, the operation of the Huffman decoder shown in FIG. 1 using the converting Huffman table 1 prepared as described above will be described with reference to a flowchart shown in FIG. 5.

It is assumed that the Huffman decoder is designed such that in an initial state thereof, the selector 4 selects the output from the counter 3. First, in a step S1, the count adr of the counter 3 is initialized to 0, and the process proceeds to a step S2, wherein data (the flag DH and decoded data ("A")) of the read address #0 of the converting Huffman table 1 are read out, and then the flag and the decoded data are separated from each other, i.e. separately and temporarily stored.

Then, in a step S3, it is determined whether or not the read flag is S. In the present case, since the flag read out from the address #0 is the flag DH, the answer to this question is negative (NO), so that the process proceeds to a step S5, wherein the bit-extracting/determining section 5 acquires one bit (I) (first bit in the present case) from the input data stream. It should be noted that when the read flag is the flag S, the separated data is outputted as the decoded data (step S4).

Then, the program proceeds to a step S6, wherein it is determined whether or not the read and separated flag is the flag JH. If the answer to this question is affirmative (YES), the program proceeds to a step S7, wherein it is determined whether or not the bit I acquired in the step S5 is 0. If the bit I is 0, the process proceeds to a step S8, wherein the count adr of the counter 3 is incremented by 1, followed by the process returning to the step S2, wherein data is read from an address of the converting Huffman table 1, which corresponds to the incremented count. On the other hand, if the acquired bit I is 1, the process proceeds to a step S9, wherein the data (indicating a jump destination address) stored together with the flag JH is set to the read address, and then the process returns to the step S2, wherein data is read from the thus updated address of the converting Huffman table 1. More specifically, the input to the selector 4 is switched to the output from the converting Huffman table 1, and the data (jump destination address) stored together with the flag JH is set to the read address.

On the other hand, if the answer to the question of the step S6 is negative (NO), the process proceeds to a step S10, wherein it is determined whether or not the read and separated flag is the flag DH. If the answer to this question is affirmative (YES), i.e. if the read flag is the flag DH, the process proceeds to a step S11, wherein it is determined whether or not the acquired one bit I is 0. If the answer to this question is affirmative (YES), the counter 3 increments the read address by 1 (step S12), and the process returns to the step S2, wherein data is read from the address of the converting Huffman table 1. On the other hand, if the acquired one bit I is 1, the process proceeds to a step S4, wherein the decoded data read out together with the flag DH is outputted.

Further, when the answer to the question of the step S10 is negative (NO), i.e. if the read and separated flag is the flag DL, the process proceeds to a step S13, wherein it is determined whether or not the one bit I acquired in the step S5 is 0. If the answer to this question is affirmative (YES), the decoded data stored together with the flag DL is outputted (step S4). On the other hand, if the acquired one bit I is 1, the process proceeds to a step S14, wherein the count adr of the counter 3 is incremented by 1, and the process proceeds to the step S2, and the steps described above are repeatedly carried out until decoded data is outputted to terminate the processing.

Now, an example of decoding input data stream "01100"will be described. Here, it is assumed that the most significant bit is inputted first.

First, in the steps S1, S2, the flag DH and decoded data ("A") are read out from the address #0 of the converting Huffman table 1. At this time, the answer to the question of the step S3 is negative (NO), and in the step S5, the first bit ('0') of the input data stream is acquired (I=0). Then, the answers to the respective questions of the steps S6, S10, and S11, are negative (NO), affirmative (YES), and affirmative (YES), respectively, and in the step S2 following execution of the step S12, data (flag DL and decoded data ("B")) are read out from the address #1 of the converting Huffman table.

Then, the question of the step S3 becomes negative (NO), and in the step S5, the next bit ('1') of the input data is read out (I=1). Then, the answers to the questions of the steps S6, S10, and S13 become negative (NO), negative (NO), and negative (NO), respectively, so that in the step S14, the address is incremented by 1, and in the step S2, the data (flag DL and decoded data ("C")) are read out from the address #2 of the table 1.

At this time, the answer to the question of the step S3 becomes negative (NO), and in the step S5, the next one bit ('1') of the input data is acquired (I=1). Then, the answers to the questions of the steps S6, S10, and S13 become negative (NO), negative (NO), and negative (NO), respectively, so that in the step S14, the address is incremented by 1, and in the step S2, the data (flag JH and decoded data ("10")) are read out from the address #3 of the table 1.

Then, the answer to the question of the step S3 becomes negative (NO), and in the step S5, the next one bit ('0') of the input data is read out. In this case, the answers to the questions of the steps S6 and S7 both become affirmative (YES), so that in the step S8, the address is incremented by 1, and in the step S2, the data (flag DL and decoded data ("E")) are read out from the address #4 of the converting Huffman table 1.

Then, the answer to the question of the step S3 becomes negative (NO), and in the step S5, the next one bit ('0') of the input data is read out. The answers to the questions of the steps S6, S10, and S13 become negative (NO), negative (NO), and affirmative (YES), respectively, so that in the step S4, the decoded data ("E") read out is outputted. Then, from the step S1, decoding of the next input data stream of the Huffman encoded data is carried out again.

As described above, according to the Huffman decoding method of the present embodiment, in accordance with inputting of each Huffman encoded bit, the binary tree-based search of the converting Huffman table is carried out, Therefore, the frequency of access to the converting Huffman table 1 is reduced to thereby decrease processing load.

Further, a comparison between the FIG. 3 Huffman decoding table and the FIG. 6 Huffman coding table shows that assuming that the data length of the decoded data is 20 bits, in the case of the FIG. 6 Huffman coding table, the code length is 3 bits long and the codeword is 7 bits long, so that 30 bits are necessary per word. The number of lines of the table is 12, so that a total of 30×12=360 bits is necessary. On the other hand, in the FIG. 3 converting Huffman table, the decoded data is 20 bits long and the flag is two bits long, so that 22 bits are necessary per word. The number of lines of the table is larger than that of the FIG. 6 case by 2, i.e. equal to 14. Therefore, a total of 22×14=308 bits is necessary. Thus, the present invention is capable of decreasing the required memory capacity.

Further, considering the possibility of installing the Huffman decoder in a DSP, according to the conventional technique, it is not necessarily possible to contain the elements of data, a code length, and a codeword in one word in a memory. The number of bits required for storing a code length and a codeword depends on the Huffman coding table. Further, when the above three elements are collectively stored in the memory, it is necessary to separate the stored read data into the three elements, and further, the data bus width has a limitation. If the three elements are separately stored in three words, the larger memory is consumed accordingly.

In contrast, in the case of the present invention, the number of bits increased for storing a flag is 2 bits for all the cases, and hence (data bus width−2) bits can be always allocated to a data storage area for storing each word.

Although in the above described embodiment, the Huffman coding table is given in advance, this is not limitative, the Huffman decoding method and decoder, the Huffman decoding table and the method of preparing the table according to the present invention can be applied to a case in which the Huffman coding table is sent together with coded data.

Further, the binary tree and the manner of search of the same are not limited to those employed in the above-described embodiment, but the binary tree may have other configurations and also different search manners may be employed accordingly. For example, instead of acquiring input data bit by bit, the input data may be acquired by more than one bit.

Further, the objects of the present invention can also be achieved by supplying a system or an apparatus with a storage medium storing a program code, or by downloading the program code via a network, for realizing the above-described embodiment. In this case, the program code read from the storage medium or downloaded via the network achieves the novel functions of the present invention, and the storage medium storing the program code constitutes the present invention.

The storage medium for supplying the program code may be a floppy disk, a hard disk, an optical memory disk, a magneto-optical disk, a CD-ROM, an MO, a CD-R, a DVD, a magnetic tape, a nonvolatile memory card, or the like. However, the storage medium is not limited to a specific one, and any medium which is capable of storing the above program code can be employed.

What is claimed is:

1. A Huffman decoding method of decoding input data encoded by a Huffman code, comprising the steps of:

preparing a table describing a binary tree corresponding to the Huffman code and having leaves each storing data; and carrying out a binary-tree based search of the table, based on the input data sequentially acquired by at least one bit to thereby decode the input data encoded by the Huffman code, wherein the binary tree has first nodes having the leaves connected thereto, second nodes having no leaves connected thereto, and the table stores words corresponding to the leaves of the binary tree, and words corresponding to the second nodes having no leaves connected thereto, wherein the table stores, as the words corresponding to the leaves of the binary tree, decoded data corresponding to the data stored in the leaves, and flags for controlling outputting of the decoded data, and flags for controlling outputting of the decoded data, and wherein the table stores, as the words corresponding to the second nodes having no leaves connected thereto, an address of a word corresponding to one of two of the first or second nodes connected as branches to each of the second nodes, and a flag for controlling whether or not the second nodes should be branched to the address.

2. A Huffman decoder that decodes input data encoded by a Huffman code, comprising:

a table describing the binary tree corresponding to the Huffman code;

a bit-extracting and determining section that extracts one bit by one bit from the input data and determines a value of the extracted one bit;

an address generating section that generates a read address for said table;

a read address-controlling section that controls the read address for said table to be outputted by said address generating section according to the value of the extracted one bit by said bit-extracting and determining section; and an output section that carries out a binary tree-based search of said table, and outputs decoded data corresponding to the input data.

3. A Huffman decoding table that describes a binary tree corresponding to a Huffman code, and having leaves each storing data, wherein the binary tree has first nodes having leaves connected thereto, second nodes having no leaves connected thereto, and the Huffman decoding table stores words corresponding to the leaves of the first nodes of the binary tree, and words corresponding to the second nodes having no leaves connected thereto, wherein the Huffman decoding table stores as the words corresponding to the leaves of the binary tree, decoded data corresponding to data stored in the leaves, and flags for controlling outputting of the decoded data, and wherein the Huffman decoding table stores, as the words corresponding to the second nodes having no leaves connected thereto, and address of a word corresponding to one of two of the first or second nodes connected as branches to each of the second nodes, and a flag for controlling whether or not the second nodes should be branched to the address.

4. A method of preparing a Huffman decoding table for decoding data encoded by a Huffman code, comprising the steps of:

a first step of preparing a table describing a binary tree corresponding to the Huffman code and having leaves each storing data from a Huffman code table describing the Huffman code, the binary tree having first nodes having the leaves connected thereto, and second nodes having no leaves connected thereto;

a second step of preparing $words_1$ each comprising decoded data corresponding to the data stored in each of the leaves, and a flag for controlling outputting of the decoded data, in a manner associated with the leaves of the binary tree prepared in the first step;

a third step of preparing $words_1$ each comprising an address of a word corresponding to one of two of the first or second nodes as branches to the second nodes, and a flag for controlling whether or not the secopd nodes should be branched to the address, in a manner associated with the second nodes of the binary tree prepared in the first step; and a fourth step of arranging the words prepared in the second step and the third step, in order of search of the binary tree.

5. A computer-readable storage medium storing a program for executing a method of preparing a Huffman decoding table for decoding data encoded by a Huffman code, the program comprising:

a first module preparing a table describing a binary tree corresponding to the Huffman code and having leaves each storing data from a Huffman code table describing the Huffman code, the binary tree having first nodes having the leaves connected thereto, and second nodes having no leaves connected thereto;

a second module for preparing $words_1$ each comprising decoded data corresponding to the data stored in each of the leaves, and a flag for controlling outputting of the decoded data, in a manner associated with the leaves of the binary tree prepared in the first step;

a third module for preparing $words_1$ each comprising an address of a word corresponding to one of two of the first or second nodes as branches to the second nodes, and a flag for controlling whether or not the secopd nodes should be branched to the address, in a manner associated with the second nodes of the binary tree prepared in the first step; and a fourth step of arranging the words prepared in the second step and the third step, in order of search of the binary tree.

* * * * *